United States Patent
Kato et al.

(10) Patent No.: US 10,700,112 B2
(45) Date of Patent: Jun. 30, 2020

(54) SOLID-STATE IMAGE PICKUP DEVICE IMAGE PICKUP SYSTEM USING SOLID-STATE IMAGE PICKUP DEVICE AND METHOD OF MANUFACTURING SOLID-STATE IMAGE PICKUP DEVICE

(71) Applicant: CANON KABUSHIKI KAISHA, Tokyo (JP)

(72) Inventors: Aiko Kato, Machida (JP); Kouhei Hashimoto, Oita (JP); Seiichi Tamura, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/150,033

(22) Filed: Oct. 2, 2018

(65) Prior Publication Data

US 2019/0035840 A1    Jan. 31, 2019

Related U.S. Application Data

(63) Continuation of application No. 15/264,403, filed on Sep. 13, 2016, now Pat. No. 10,115,755, which is a continuation of application No. 14/957,352, filed on Dec. 2, 2015, now Pat. No. 9,466,627, which is a continuation of application No. 13/473,455, filed on May 16, 2012, now Pat. No. 9,236,410.

(30) Foreign Application Priority Data

May 27, 2011    (JP) .................................. 2011-119257

(51) Int. Cl.
*H01L 27/146* (2006.01)
*H04N 5/357* (2011.01)

(52) U.S. Cl.
CPC .... *H01L 27/14623* (2013.01); *H01L 27/1463* (2013.01); *H01L 27/14612* (2013.01); *H01L 27/14636* (2013.01); *H01L 27/14656* (2013.01); *H01L 27/14685* (2013.01); *H01L 27/14689* (2013.01); *H04N 5/357* (2013.01)

(58) Field of Classification Search
CPC . H01L 31/0216; H01L 31/0224; H01L 31/18; H01L 27/14612; H01L 27/14689; H01L 27/14636; H01L 27/14623; H01L 27/146
See application file for complete search history.

(56) References Cited

U.S. PATENT DOCUMENTS

2010/0225776 A1\* 9/2010 Taura ................ H01L 27/14609
348/222.1

\* cited by examiner

*Primary Examiner* — Matthew C Landau
*Assistant Examiner* — Dmitriy Yemelyanov
(74) *Attorney, Agent, or Firm* — Canon U.S.A., Inc. IP Division

(57) ABSTRACT

In a solid-state image pickup device including a pixel that includes a photoelectric conversion portion, a carrier holding portion, and a plurality of transistors, the solid-state image pickup device further includes a first insulating film disposed over the photoelectric conversion portion, the carrier holding portion, and the plurality of transistors, a conductor disposed in an opening of the first insulating film and positioned to be connected to a source or a drain of one or more of the plurality of transistors, and a light shielding film disposed in an opening or a recess of the first insulating film and positioned above the carrier holding portion.

18 Claims, 10 Drawing Sheets

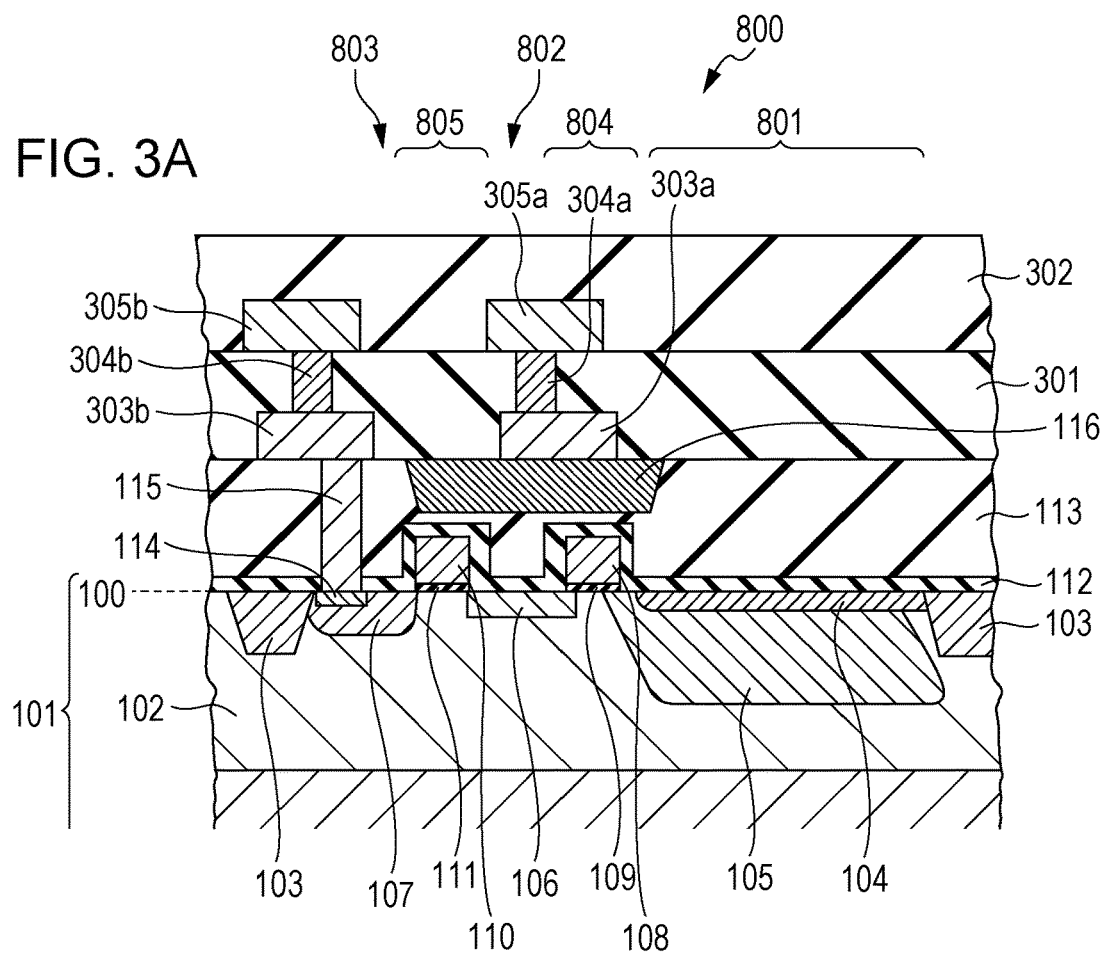
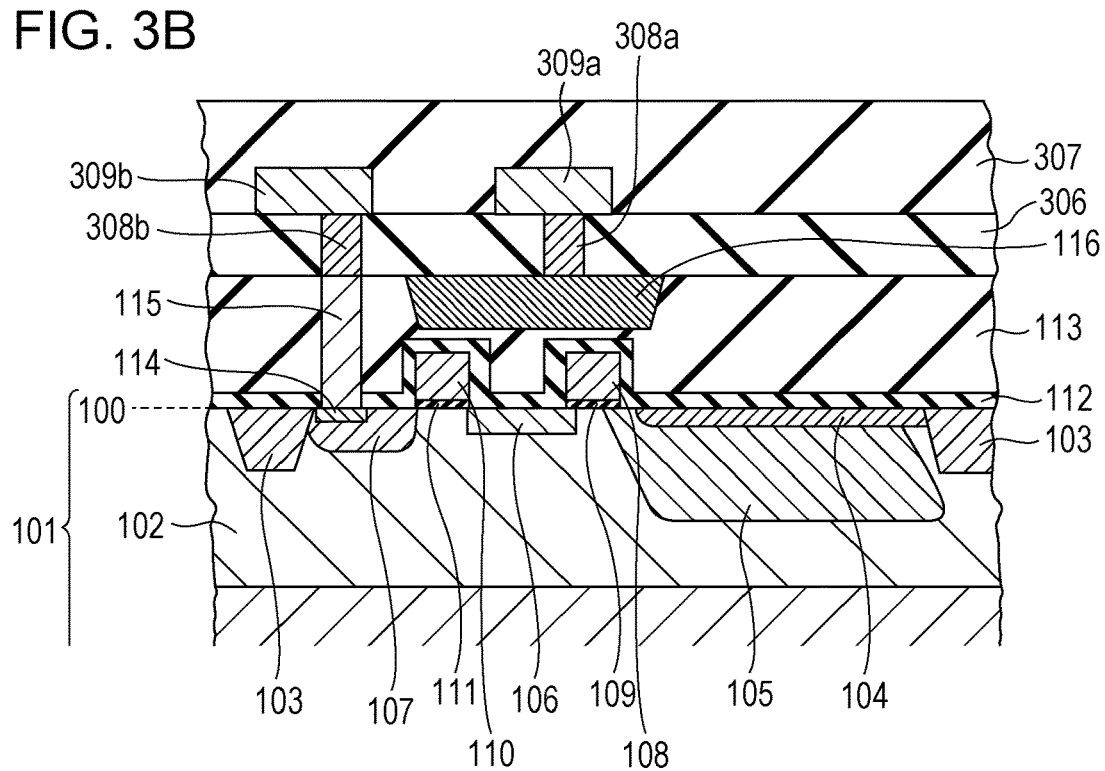

SOLID-STATE IMAGE PICKUP DEVICE IMAGE PICKUP SYSTEM USING SOLID-STATE IMAGE PICKUP DEVICE AND METHOD OF MANUFACTURING SOLID-STATE IMAGE PICKUP DEVICE

CROSS-REFERENCE TO RELATED APPLICATION

This application is a Continuation of U.S. application Ser. No. 15/264,403, filed Sep. 13, 2016, which is a Continuation of application Ser. No. 14/957,352, filed Dec. 2, 2015, which is a Continuation of U.S. application Ser. No. 13/473,455, filed May 16, 2012, now becomes U.S. Pat. No. 9,236,410, issued Jan. 12, 2016, which claims priority from Japanese Patent Application No. 2011-119257 filed May 27, 2011, which are hereby incorporated by reference herein in their entireties.

BACKGROUND OF THE INVENTION

Field of the Invention

One disclosed aspect of the embodiments relates to a solid-state image pickup device, an image pickup system using the solid-state image pickup device, and a method of manufacturing the solid-state image pickup device.

Description of the Related Art

In an active-pixel type solid-state image pickup device represented by a Complementary Metal Oxide Semiconductor (CMOS) image sensor, it is proposed to a device having a global electronic shutter function or including focus detection pixels.

The global electronic shutter function is a function of starting and ending accumulation of photo-carriers (photo-charges) in a plurality of pixels, which are arrayed in a matrix pattern, simultaneously for all the pixels. The solid-state image pickup device having the global electronic shutter function includes, in each pixel, a photoelectric conversion portion and a carrier holding portion configured to hold carriers, which are generated by photoelectric conversion, for a certain time. The carrier holding portion in the solid-state image pickup device having the global electronic shutter function holds the carriers for a period from the end of the accumulation of the photo-carriers to read of the accumulated photo-carriers. There is a possibility that if, during such a period, carriers generated other than the photoelectric conversion portion are mixed into the carrier holding portion, the mixed carriers may generate a noise signal, thus causing degradation of image quality. Japanese Patent Laid-Open No. 2008-004692 discloses a structure where each pixel includes a photoelectric conversion portion and a carrier holding portion, and a light shielding film is disposed on the carrier holding portion.

Japanese Patent Laid-Open No. 2009-105358 discloses a solid-state image pickup device including focus detection pixels, in which a light shielding film having a slit is disposed in the focus detection pixel. Japanese Patent Laid-Open No. 2008-004692 mentions the light shielding film, but detailed discussion is not made regarding the light shielding film. Depending on the arrangement of the light shielding film, oblique light may become apt to enter the carrier holding portion, and carriers generated by the oblique light may be mixed into the carriers held in the carrier holding portion.

The solid-state image pickup device disclosed in Japanese Patent Laid-Open No. 2009-105358 also accompanies with a similar problem to that described above because detailed discussion is not made regarding the light shielding film including the slit.

SUMMARY OF THE INVENTION

One disclosed aspect of the embodiments provides a solid-state image pickup device including a light shielding film that has high light shielding performance, and a method of manufacturing solid-state image pickup device.

According to one embodiment, there is provided a solid-state image pickup device including a pixel, which includes a photoelectric conversion portion, a carrier holding portion configured to hold carriers generated in the photoelectric conversion portion, and a plurality of transistors configured to output a signal based on the carriers in the carrier holding portion; a first insulating film disposed over the photoelectric conversion portion, the carrier holding portion, and the plurality of transistors; and a conductor disposed in an opening of the first insulating film and positioned to be connected to a source or a drain of one or more of the plurality of transistors, wherein the solid-state image pickup device further includes a light shielding film disposed in an opening or a recess of the first insulating film and positioned above the carrier holding portion.

According to another embodiment, there is provided a method of manufacturing a solid-state image pickup device including a photoelectric conversion portion, a carrier holding portion configured to hold carriers generated in the photoelectric conversion portion, and a plurality of transistors including a transistor to output a signal based on the carriers in the carrier holding portion, the method including the operations of forming a first insulating film that covers the photoelectric conversion portion, the carrier holding portion, and the plurality of transistors, removing a part of the first insulating film above the carrier holding portion, and forming a light shielding film in a portion that is formed by removing the part of the first insulating film.

Further features of the disclosure will become apparent from the following description of exemplary embodiments with reference to the attached drawings.

BRIEF DESCRIPTION OF THE DRAWINGS

FIG. 3A is a schematic sectional view to explain the solid-state image pickup device according to the first embodiment.

FIG. 3B is a schematic sectional view to explain the solid-state image pickup device according to the first embodiment.

DESCRIPTION OF THE EMBODIMENTS

A solid-state image pickup device according to an embodiment includes a photoelectric conversion portion, a plurality of transistors, an insulating film disposed over the photoelectric conversion portion and the plurality of transistors, and a conductor disposed in an opening of the insulating film and positioned to be connected to a source or a drain of one or more of the plurality of transistors. The solid-state image pickup device further includes a light shielding film disposed in the insulating film in which the conductor is disposed. The light shielding film is disposed in the insulating film at a position above a structure that is to be shielded from light, e.g., above a carrier holding portion in a solid-state image pickup device having the global electronic shutter function or above a photoelectric conversion portion in a solid-state image pickup device including focus detection pixels. Such an arrangement contributes to increasing light shielding performance of the light shielding film.

In the following description, a direction toward the inside of a semiconductor substrate from a surface of the semiconductor substrate is defined as a downward direction, and a direction opposed to that direction is defined as an upward direction. Also, the following embodiments are described in connection with the case that signal carriers (charge carriers) are electrons.

The embodiments will be described in detail below with reference to the drawings.

First Embodiment

Figure 8:
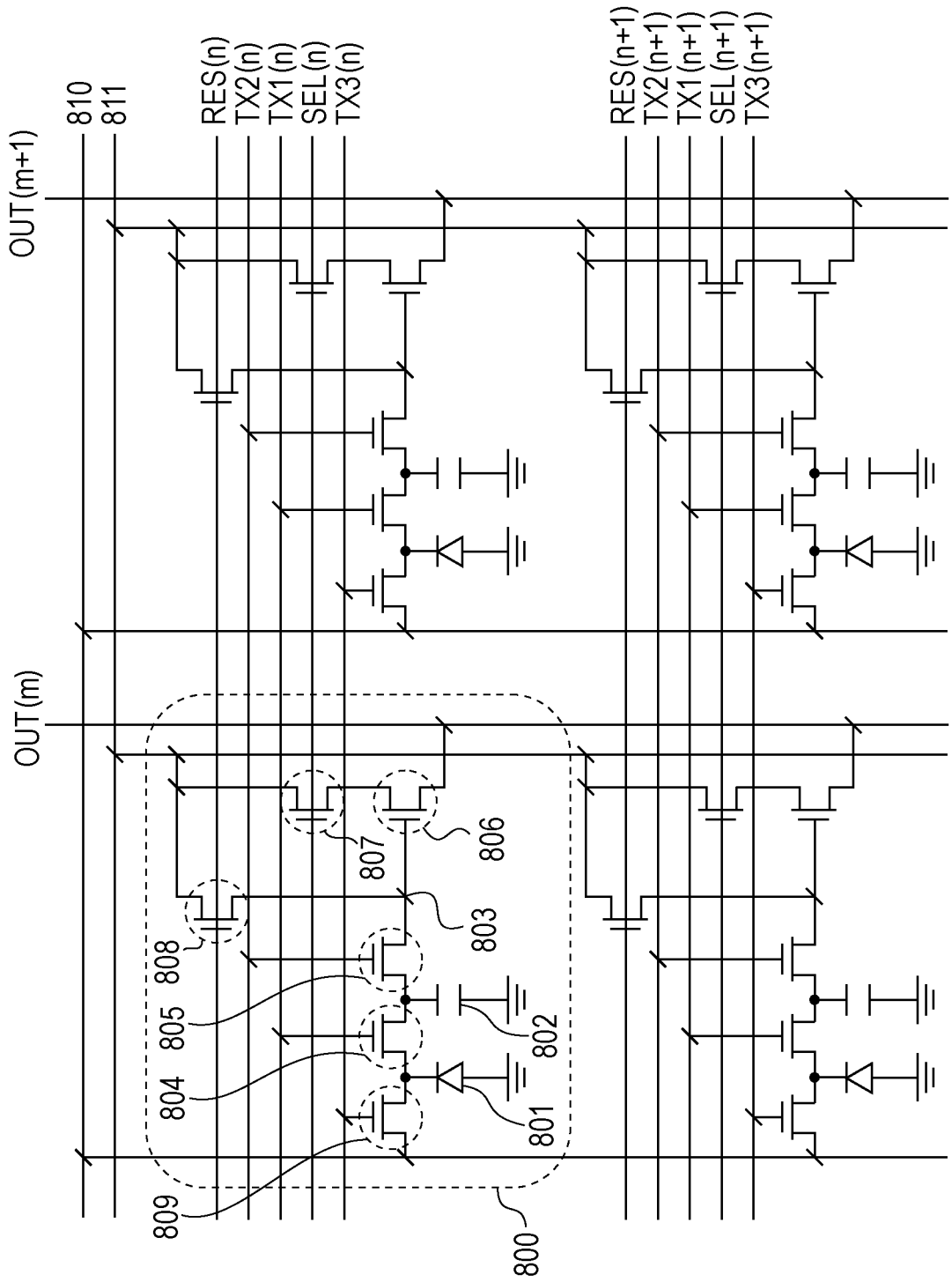
FIG. 8 illustrates an example of a pixel circuit in a solid-state image pickup device.

FIG. 8 is a circuit diagram for four pixels in a solid-state image pickup device according to a first embodiment. In FIG. 8, pixels 800 are arrayed in two rows and two columns. Each of the pixels 800 includes a photoelectric conversion portion 801, a carrier holding portion 802, a first transfer transistor 804, a second transfer transistor 805, an amplification transistor 806, a selection transistor 807, and a reset transistor 808. The pixel 800 further includes a third transfer transistor 809 for overflow drain (hereinafter abbreviated to "OFD") to drain useless carriers. Reference numeral 803 in the pixel 800 denotes a node including a floating diffusion portion (hereinafter referred to as an "FD portion"). A power line 810 and a power line 811 are each a wiring to supply a predetermined voltage. The power line 810 is connected to a main electrode region of the OFD transistor 809. The power line 811 is connected to respective main electrode regions of the reset transistor 808 and the selection transistor 807. RES, TX1, TX2, SEL and TX3 represent control lines for supplying pulses to respective gate electrodes of the corresponding transistors. The pulses are supplied from a vertical scanning circuit (not illustrated). In more detail, RES represents a control line for supplying a pulse to the gate electrode of the reset transistor 808, TX1 represents a control line for supplying a pulse to the gate electrode of the first transfer transistor 804, and TX2 represents a control line for supplying a pulse to the gate electrode of the second transfer transistor 805. SEL represents a control line for supplying a pulse to the gate electrode of the selection transistor 807, and TX3 represents a control line for supplying a pulse to the gate electrode of the third transfer transistor 809. OUT represents a signal line. Characters n and m in FIG. 8 are each a natural number. Thus, n represents a certain row, and n+1 represents a row adjacent to the certain row n. Further, m represents a certain column, and m+1 represents a column adjacent to the certain row m. The signal output from the signal line OUT is held in a read circuit (not illustrated) and is output to the outside of the solid-state image pickup device after being subjected to processing such as amplification and addition. On that occasion, control signals for controlling the processing, such as the signal addition, and the signal outputting to the outside may be supplied from a horizontal scanning circuit (not illustrated). A constant-current source constituting a source follower circuit in combination with the amplification transistor may be disposed in the signal line OUT. In FIG. 8, the pixel 800 is a structure including one photoelectric conversion portion 801 and is a minimum repetition unit in the structure of the solid-state image pickup device. It is to be noted that the pixel 800 is not limited to the above-described structure. For example, one amplification transistor may be shared by a plurality of pixels.

A global shutter operation in the pixel 800 of FIG. 8 is performed as follows. After the lapse of a certain accumulation period, signal carriers generated in the photoelectric conversion portion 801 are transferred to the carrier holding portion 802 through the first transfer transistor 804. While the carrier holding portion 802 is holding the signal carriers for the certain accumulation period, the accumulation of signal carriers is started again in the photoelectric conversion portion 801. The signal carriers in the carrier holding portion 802 are transferred to the node 803, including the FD portion, through the second transfer transistor 805 and are output as a signal from the amplification transistor 806. In some cases, the signal carriers in the photoelectric conversion portion 801 may be drained through the third transfer transistor 809 so that the signal carriers generated in the photoelectric conversion portion 801 are not mixed into the carrier holding portion 802 while the carrier holding portion 802 is holding the signal carriers. The reset transistor 808 sets the node 803, including the FD portion, to a predetermined potential (called a reset operation) before the signal carriers are transferred thereto from the carrier holding portion 802. A noise signal may be removed by outputting, as the noise signal, the potential of the node 803 including the FD portion at that time to the signal line OUT through the amplification transistor 806, and by taking a differential between the noise signal and a later-output signal on the basis of the signal charges.

Figure 1A:
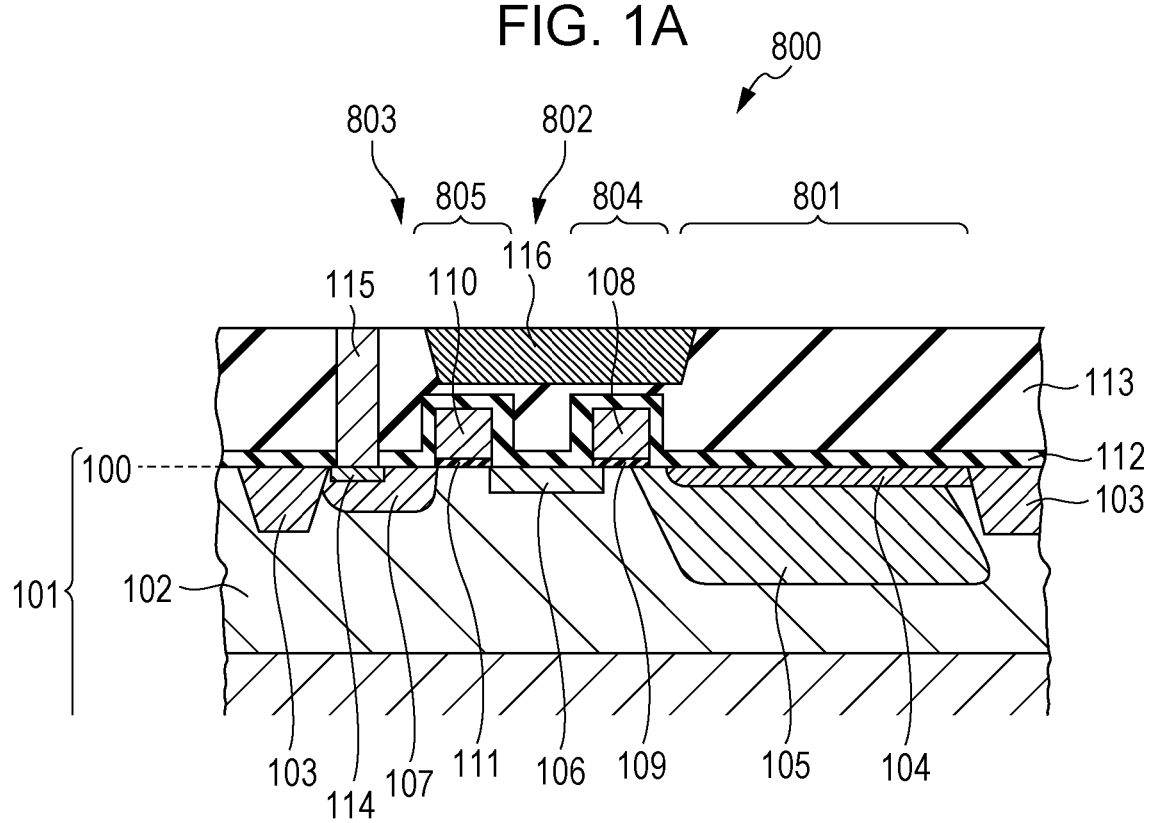
FIG. 1A is a schematic sectional view of a solid-state image pickup device according to a first embodiment.

Regarding the solid-state image pickup device including the carrier holding portion which may perform the global shutter operation described above, FIG. 1A illustrates a light shielding arrangement for the carrier holding portion. FIG. 1A is a schematic sectional view illustrating the photoelectric conversion portion 801, the carrier holding portion 802, and the floating diffusion portion (FD portion) 803 illustrated in FIG. 8, as well as a light shielding film 116 arranged above the carrier holding portion 802. Although a structure above the light shielding film 116 is omitted, a wiring structure, a protection film, a color filter, an in-layer lens, a microlens, etc. may be arranged as appropriate above the light shielding film 116. The same components in FIG. 1A as those in FIG. 8 are denoted by the same reference numerals and description of those components is omitted.

In FIG. 1A, a semiconductor substrate 101 is, e.g., a silicon semiconductor substrate. The semiconductor substrate 101 has a surface 100 and a P-type semiconductor region 102 formed therein. An element isolation region 103 is disposed in the semiconductor substrate 101 and is formed by the STI (Shallow Trench Isolation) method. The photoelectric conversion portion 801 includes an N-type semiconductor region 105 functioning as a carrier accumulation portion, and a P-type semiconductor region 104 disposed on the N-type semiconductor region 105. An N-type semiconductor region 106 constitutes the carrier holding portion 802, and an N-type semiconductor region 107 constitutes the floating diffusion portion (FD portion) 803. A gate electrode 108 constituting the first transfer transistor 804 is disposed on a gate insulating film 109 that is disposed on the surface 100 of the semiconductor substrate 101. The gate electrode 108 is positioned between the N-type semiconductor region 105 and the N-type semiconductor region 106. A gate electrode 110 constituting the second transfer transistor 805 is disposed on a gate insulating film 111 that is disposed on the surface 100 of the semiconductor substrate 101, and it is positioned between the N-type semiconductor region 106 and the N-type semiconductor region 107. An insulating film integral with the gate insulating film 111 or an insulating film separate therefrom may be disposed on the surface 100 in an area other than under the gate electrode 110.

In FIG. 1A, an insulating film 112 (second insulating film) is disposed to cover the photoelectric conversion portion 801, the gate electrode 108, the gate electrode 110, etc. Further, an insulating film 113 (first insulating film) is disposed on the insulating film 112. The insulating film 113 is a silicon oxide film, for example, and it may function as an interlayer insulating film. The insulating film 113 may also function as a planarizing film that planarizes unevenness caused by the presence of the gate electrodes, etc. The insulating film 112 is a silicon nitride film, for example, and it may function as a protection film for the surface of the photoelectric conversion portion 801. Further, the insulating film 112 has a higher refractive index than the insulating film 113, and the insulating film 112 may function as an antireflection film that reduces reflection at the surface of the photoelectric conversion portion 801. The insulating film 112 may be a layered film made up of a silicon nitride film, a silicon oxide film, a silicon oxynitride film, etc.

In FIG. 1A, a conductor 115 disposed in respective openings of the insulating film 112 and the insulating film 113 may function as a contact plug. The conductor 115 is made of, e.g., tungsten. A metal wiring (not illustrated) is arranged on the conductor 115. An N-type semiconductor region 114 is disposed to establish ohmic connection between the conductor 115 serving as the contact plug and the semiconductor region 107, and it has a higher impurity concentration than the semiconductor region 107. The light shielding film 116 is disposed in the insulating film 113 to cover the N-type semiconductor region 106 constituting the carrier holding portion 802. The light shielding film 116 is made of, e.g., tungsten.

Thus, since the light shielding film 116 is disposed in the insulating film 113 where the conductor 115 serving as the contact plug is disposed, i.e., on the side closer to the surface 100 of the semiconductor substrate 101 than the metal wiring, light may be blocked at a position closer to the N-type semiconductor region 106 constituting the carrier holding portion 802. It is hence possible to reduce mixing of light into the carrier holding portion 802 and to obtain higher light shielding performance.

The light shielding film 116 is formed to extend from a position above the gate electrode 110 of the second transfer transistor 805 up to a position above the photoelectric conversion portion 801 while covering the carrier holding portion 802 and the gate electrode 108 of the first transfer transistor 804. Such coverage relation of the light shielding film 116 is similar in a direction perpendicular to the drawing sheet of FIG. 1A as well. Thus, since light is blocked over a wider range than the carrier holding portion 802, it is possible to reduce mixing of light into the carrier holding portion 802 and to obtain higher light shielding performance.

A method of manufacturing the solid-state image pickup device according to the first embodiment will be described below with reference to FIGS. 2A to 2G. The same components in FIGS. 2A to 2G as those in FIG. 1A are denoted by the same reference numerals and description of those components is omitted.

Figure 2A:
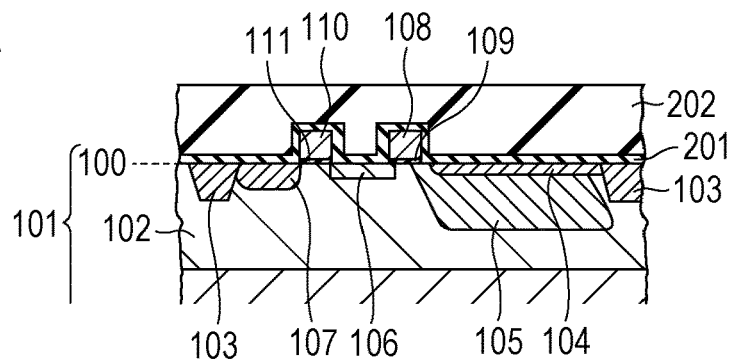
FIG. 2A is a schematic sectional view illustrating a method of manufacturing the solid-state image pickup device according to the first embodiment.

First, in FIG. 2A, the P-type semiconductor region 102, the element isolation region 103, the N-type semiconductor region 105, the P-type semiconductor region 104, the N-type semiconductor region 106, and the N-type semiconductor region 107 are formed in the semiconductor substrate 101. The element isolation region 103 is formed by the STI method, and the semiconductor regions are formed by photolithography and ion implantation. Further, the gate electrode 108 and the gate electrode 110 are formed by photolithography and etching by using polysilicon. At the same time, the gate insulating film 109 and the gate insulating film 111 are also formed. Those components may be formed by using general semiconductor techniques, and detailed description of methods for forming them is omitted. Moreover, the order of operations of forming those components is optionally selected.

Further, as illustrated in FIG. 2A, an insulating film 201 made of a silicon nitride film is formed by low-pressure CVD (LPCVD) to cover the surface 100 of the semiconductor substrate 101 and the gate electrodes 108 and 110. An insulating film 202 made of a silicon oxide film is then formed over the insulating film 201. In this state, the insulating film 201 has a surface following the unevenness corresponding to the gate electrodes, etc., while the insulating film 202 planarizes the unevenness corresponding to the gate electrodes, etc. and has a flat surface.

Figure 2B:
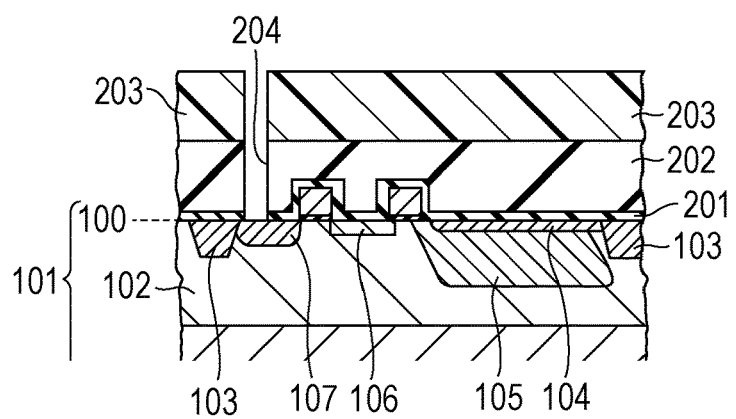
FIG. 2B is a schematic sectional view illustrating the method of manufacturing the solid-state image pickup device according to the first embodiment.

Next, as illustrated in FIG. 2B, a photoresist pattern 203 is formed on the insulating film 202. The photoresist pattern 203 serves as a mask for use in forming a contact hole 204 in the insulating film 202 and has an opening to form the contact hole 204. Etching is then carried out on the insulating films 202 and 201 with the photoresist pattern 203 used as a mask, thereby removing respective parts of the insulating films 202 and 201 and forming the contact hole 204 in the insulating films 202 and 201. At that time, the insulating film 201 may function as an etching stopper in the etching to form the contact hole.

Figure 2C:
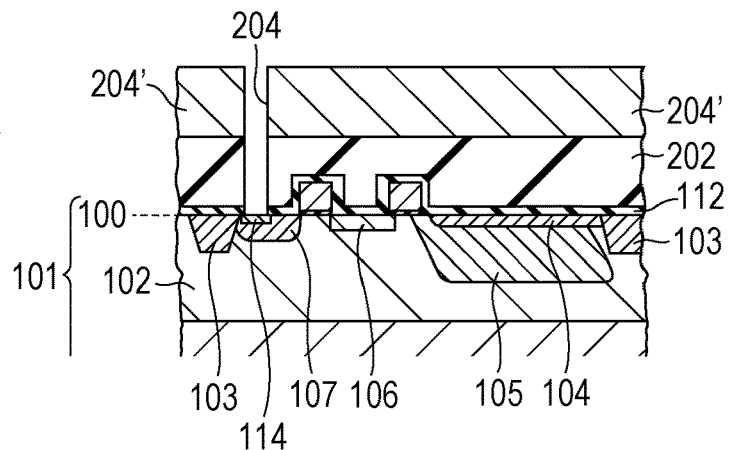
FIG. 2C is a schematic sectional view illustrating the method of manufacturing the solid-state image pickup device according to the first embodiment.

After forming the contact hole 204, an N-type impurity is ion-implanted into the contact hole 204 to form the N-type semiconductor region 114 (FIG. 2C). Further, the photoresist pattern 203 is removed and a conductor film 204' is formed (FIG. 2C). The conductor film 204' is, e.g., a layered film of titanium nitride and tungsten.

Figure 2D:
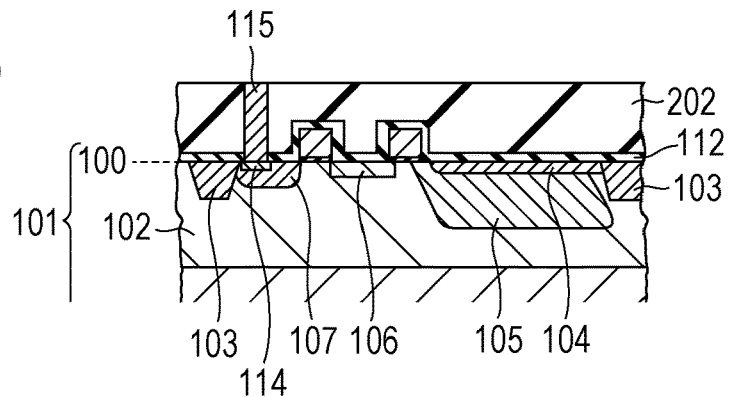
FIG. 2D is a schematic sectional view illustrating the method of manufacturing the solid-state image pickup device according to the first embodiment.

Etching or CMP is performed on the conductor film 204' to remove an extra portion of the conductor film 204', whereby the conductor 115 is formed in the contact hole 204 (FIG. 2D).

Figure 2E:
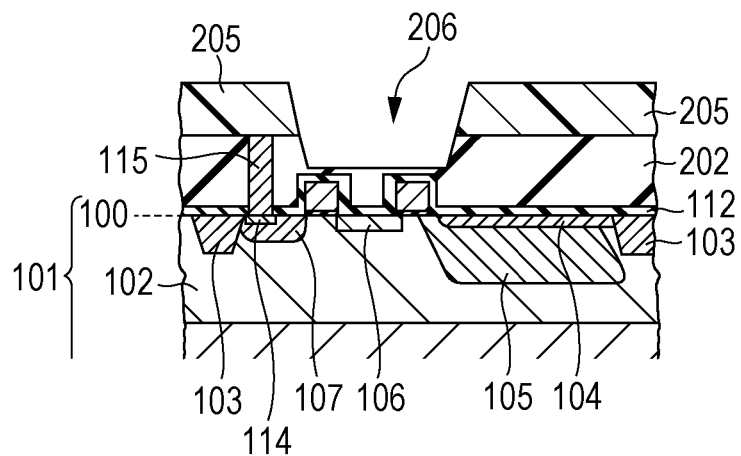
FIG. 2E is a schematic sectional view illustrating the method of manufacturing the solid-state image pickup device according to the first embodiment.

Next, a photoresist pattern 205 is formed over the conductor 115 and the insulating film 202 (FIG. 2E). The photoresist pattern 205 serves as a mask for use in forming the light shielding film 116 in the insulating film 202 and has an opening to form the light shielding film 116. Etching is then carried out on the insulating film 202 with the photoresist pattern 205 used as a mask, thereby removing a part of the insulating film 202 and forming, in the insulating film 202, a recess 206 where the light shielding film 116 is to be formed. In this state, a bottom surface the recess 206 is positioned above the gate electrodes 108 and 110.

Figure 2F:
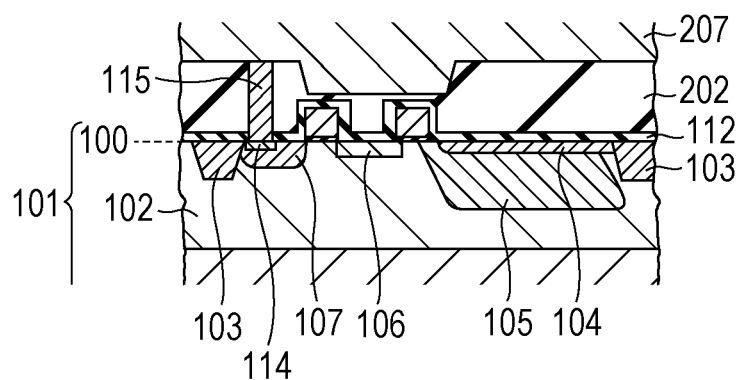
FIG. 2F is a schematic sectional view illustrating the method of manufacturing the solid-state image pickup device according to the first embodiment.
Figure 2G:
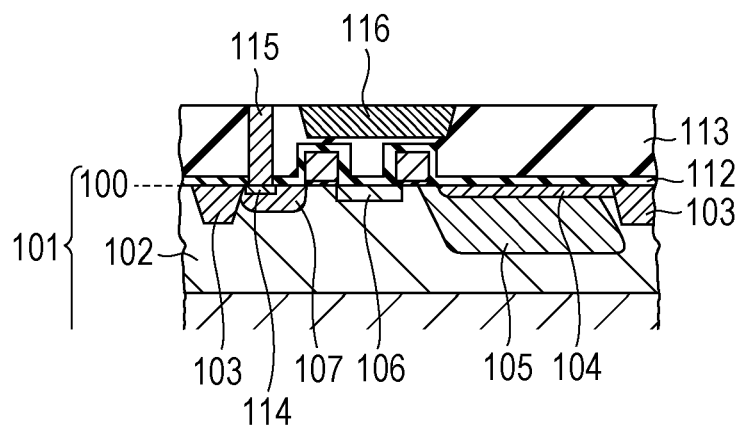
FIG. 2G is a schematic sectional view illustrating the method of manufacturing the solid-state image pickup device according to the first embodiment.

Further, the photoresist pattern 205 is removed and a conductor film 207 is formed (FIG. 2F). The conductor film 207 is, e.g., a layered film of titanium nitride and tungsten. Etching or CMP is performed on the conductor film 207 to remove an extra portion of the conductor film 207, whereby the light shielding film 116 is formed in the recess 206 that is a portion formed by removing a part of the insulating film 113. Here, the insulating film 202 becomes the insulating film 113 (FIG. 2G). In such a manner, the light shielding film 116 may be formed in the insulating film 113 in which the conductor 115 serving as the contact plug is disposed.

Figure 1B:
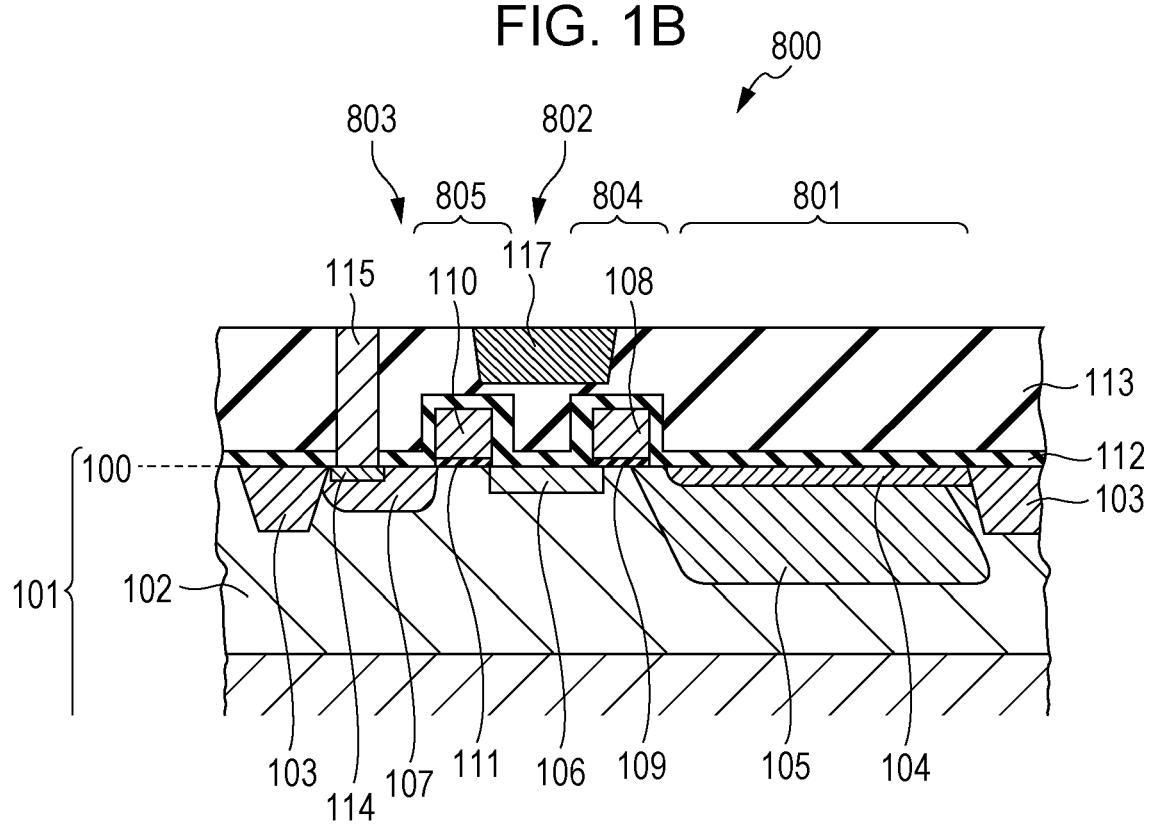
FIG. 1B is a schematic sectional view of the solid-state image pickup device according to the first embodiment.

FIG. 1B illustrates a modification of the solid-state image pickup device according to the first embodiment. The same components in FIG. 1B as those in FIG. 1A are denoted by the same reference numerals and description of those components is omitted. FIG. 1B differs from FIG. 1A in the arrangement of the light shielding film. The light shielding film 116 in FIG. 1A is formed to extend from a position above the gate electrode 110 of the second transfer transistor 805 up to a position above the photoelectric conversion portion 801 while covering the carrier holding portion 802 and the gate electrode 108 of the first transfer transistor 804. On the other hand, a light shielding film 117 in FIG. 1B is formed to extend from a position above the gate electrode 110 of the second transfer transistor 805 up to a position above the gate electrode 108 of the first transfer transistor 804 while covering the carrier holding portion 802. In other words, the light shielding film disposed in the insulating film 113 is positioned at least above the N-type semiconductor region 106 constituting the carrier holding portion 802. With such an arrangement, since the light shielding film is disposed near the carrier holding portion 802, mixing of light into the carrier holding portion 802 may be reduced.

A wiring structure of the solid-state image pickup device according to the first embodiment will be described below with reference to FIGS. 3A and 3B. FIGS. 3A and 3B are each a schematic sectional view of the solid-state image pickup device, the view corresponding to FIG. 1A. The same components in FIGS. 3A and 3B as those in FIG. 1A are denoted by the same reference numerals and description of those components is omitted.

In FIG. 3A, the wiring structure is disposed above the insulating film 113, the light shielding film 116, and the conductor 115 illustrated in FIG. 1A. The wiring structure is made up of, e.g., an insulating film 301, an insulating film 302, a first wiring layer 303, a via layer 304, and a second wiring layer 305. The first wiring layer 303 is disposed in the insulating film 301, and it includes a wiring 303a and a wiring 303b. The via layer 304 is disposed in the insulating film 301 and includes a via 304a and a via 304b. The second wiring layer 305 is disposed in the insulating film 302, and it includes a wiring 305a and a wiring 305b. Here, each wiring is a metal wiring made of an alloy containing aluminum as a main ingredient. As an alternative, the metal wiring may be a wiring made of an alloy containing aluminum and copper as main ingredients.

Above the light shielding film 116, the wiring 303a, the via 304a, and the wiring 305a are disposed in that order as viewed in the upward direction from the light shielding film 116 and are electrically connected to each other. Above the conductor 115, the wiring 303b, the via 304b, and the wiring 305b are disposed in that order as viewed in the upward direction from the conductor 115 and are electrically connected to each other. Though not illustrated in the circuit of FIG. 8, a voltage may be supplied to the light shielding film 116. The supplied voltage is, e.g., a ground voltage, a power source voltage, and a driving voltage in match with the carrier transfer operation.

FIG. 3B illustrates a modification of the wiring structure in FIG. 3A. Description of the same components in FIG. 3B as those in FIG. 3A is omitted. In FIG. 3B, as in FIG. 3A, the wiring structure is disposed above the insulating film 113, the light shielding film 116, and the conductor 115 illustrated in FIG. 1A. The wiring structure is made up of, e.g., an insulating film 306, an insulating film 307, a first wiring layer 309, and a via layer 308. The via layer 308 is disposed in the insulating film 306, and it includes a via 308a and a via 308b. The first wiring layer 309 is disposed in the insulating film 307, and it includes a wiring 309a and a wiring 309b. Above the light shielding film 116, the via 308a and the wiring 309a are disposed in that order as viewed in the upward direction from the light shielding film 116 and are electrically connected to each other. Above the conductor 115, the via 308b and the wiring 309b are disposed in that order as viewed in the upward direction from the conductor 115 and are electrically connected to each other. The conductor 115 and the via 308b constitutes a stack contact structure in which they are directly connected to each other. In this modification, a voltage may be supplied to the light shielding film 116 as in FIG. 3A.

Thus, since the light shielding film 116 is disposed in the insulating film 113 where the conductor 115 serving as the contact plug is arranged, light may be blocked at a position close to the N-type semiconductor region 106 constituting the carrier holding portion 802. It is hence possible to reduce mixing of light into the carrier holding portion 802 and to obtain higher light shielding performance.

Second Embodiment

Figure 4A:
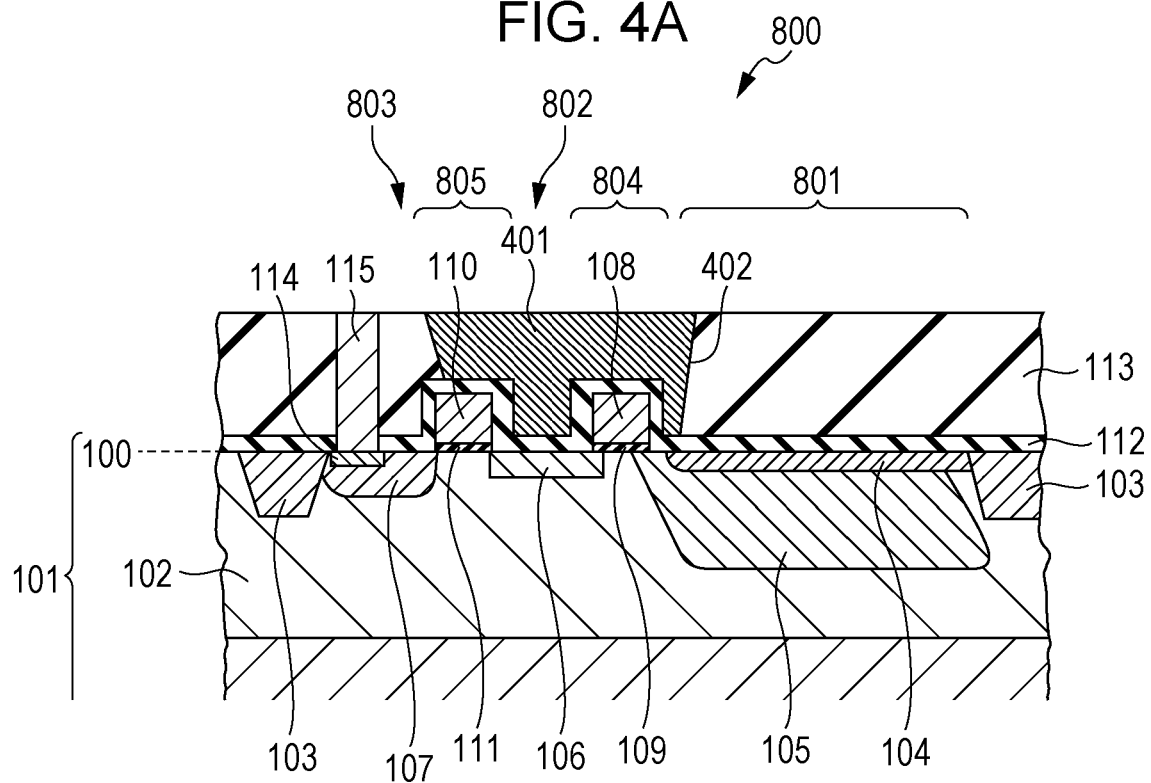
FIG. 4A is a schematic sectional view of a solid-state image pickup device according to a second embodiment.

A solid-state image pickup device according to a second embodiment will be described below with reference to FIGS. 4A, 4B and 5A to 5D. FIG. 4A is a schematic sectional view of the solid-state image pickup device, the view corresponding to FIG. 1A. The same components in FIG. 4A as those in FIG. 1A are denoted by the same reference numerals and description of those components is omitted.

FIG. 4A differs from FIG. 1A in the arrangement of the light shielding film. While the light shielding film 116 in FIG. 1A is disposed in the recess formed in the insulating film 113, a light shielding film 401 in FIG. 4A is disposed in an opening, instead of the recess, formed in the insulating film 113. The light shielding film 401 is stacked on the N-type semiconductor region 106 constituting the carrier holding portion 802 with the insulating film 112 interposed therebetween such that the light shielding film 401 fills a portion between the gate electrode 110 and the gate electrode 108. Such an arrangement may further increase the light shielding performance for the carrier holding portion 802.

Further, in FIG. 4A, the light shielding film 401 is arranged to extend from a position above the gate electrode 110 up to a position above the photoelectric conversion portion 801. Such an arrangement may reduce incoming of light into the N-type semiconductor region 106 from the photoelectric conversion portion 801, i.e., from the side of the gate electrode 108 closer the N-type semiconductor region 105. Moreover, since in the photoelectric conversion portion 801 the light shielding film 401 is disposed on the surface 100 of the semiconductor substrate 101 with the insulating film 112 interposed therebetween, incoming of light through an edge of the gate electrode 108 may also be suppressed.

Since the range where the light shielding film 401 is disposed is terminated at the position above the gate electrode 110, a sufficient distance may be held relative to the conductor 115 disposed in the semiconductor region 107. Such an arrangement may suppress short-circuiting between the conductor 115 and the light shielding film 401.

Further, the light shielding film 401 has a tapered shape such that a lateral surface 402 of the light shielding film 401 is inclined relative to the surface 100 of the semiconductor substrate 101. In more detail, the lateral surface 402 of the light shielding film 401 extends toward the surface 100 of the semiconductor substrate 101 at a certain angle relative to a direction perpendicular to the surface 100 of the semiconductor substrate 101. Such a tapered shape is beneficial in that, even when incident light is reflected at the light receiving surface of the photoelectric conversion portion 801, the reflected light may be made incident on the photoelectric conversion portion 801 because the reflected light impinges against the lateral surface 402 of the light shielding film 401.

A method of manufacturing the solid-state image pickup device according to the second embodiment will be described below with reference to FIGS. 5A to 5D. The same components in FIGS. 5A to 5D as those in FIG. 4A are denoted by the same reference numerals and description of those components is omitted. Description of similar manufacturing operations to those in the first embodiment (FIGS. 2A to 2G) is also omitted.

Figure 5A:
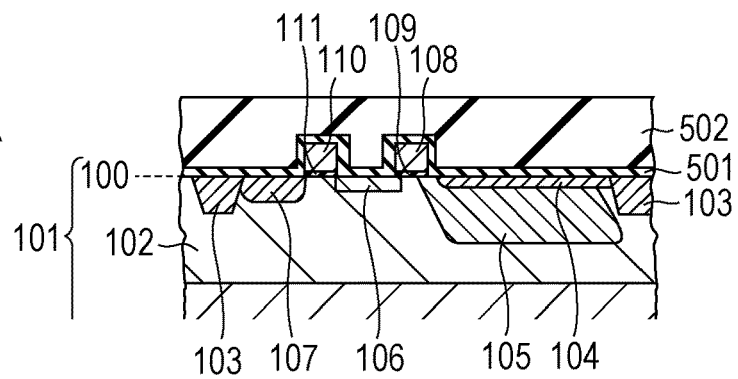
FIG. 5A is a schematic sectional view illustrating a method of manufacturing the solid-state image pickup device according to the second embodiment.

First, in FIG. 5A, the element isolation region 103, the various semiconductor regions, and the gate electrodes are formed in the semiconductor substrate 101 as in FIG. 2A. Those components may be formed by using general semiconductor techniques, and detailed description of methods for forming them is omitted. Further, as in FIG. 2A, an insulating film 501 made of a silicon nitride film is formed by low-pressure CVD (LPCVD) to cover the surface 100 of the semiconductor substrate 101 and the gate electrodes 108 and 110. An insulating film 502 made of a silicon oxide film is then formed over the insulating film 501. In this state, the insulating film 501 has a surface following the unevenness corresponding to the gate electrodes, etc., while the insulating film 502 planarizes the unevenness corresponding to the gate electrodes, etc. and has a flat surface.

Figure 5B:
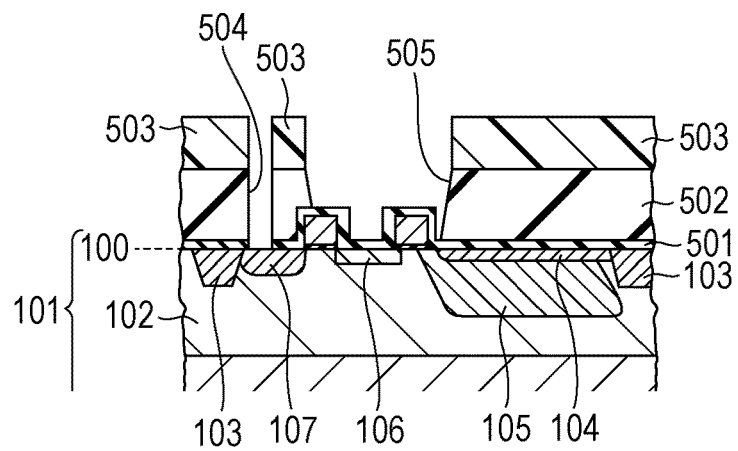
FIG. 5B is a schematic sectional view illustrating the method of manufacturing the solid-state image pickup device according to the second embodiment.

Next, as illustrated in FIG. 5B, a photoresist pattern 503 is formed on the insulating film 502. The photoresist pattern 503 serves as a mask for use in forming a contact hole 504 and a light shielding film in the insulating film 502. Thus, the photoresist pattern 503 has an opening to form the contact hole 504 and an opening to form the light shielding film. Etching is then carried out on the insulating film 502 with the photoresist pattern 503 used as a mask, thereby removing a part of the insulating film 502 and forming the contact hole 504 and an opening 505 for the light shielding film in the insulating film 502. At that time, the insulating film 501 may function as an etching stopper in the above-described etching.

Figure 5C:
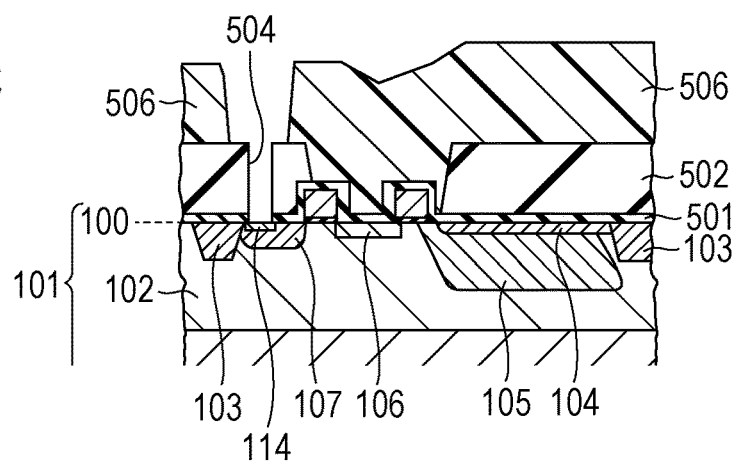
FIG. 5C is a schematic sectional view illustrating the method of manufacturing the solid-state image pickup device according to the second embodiment.

After forming the contact hole 504 and the opening 505, the photoresist pattern 503 is removed. A new photoresist pattern 506 is then formed. The new photoresist pattern 506 has an opening where the contact hole 504 is exposed, and it covers the other region than the contact hole 504. Etching is carried out with the photoresist pattern 506 used as a mask, thereby removing a part of the exposed insulating film 501. Then, an N-type impurity is ion-implanted into the contact hole 504 to form the N-type semiconductor region 114 (FIG. 5C).

Figure 5D:
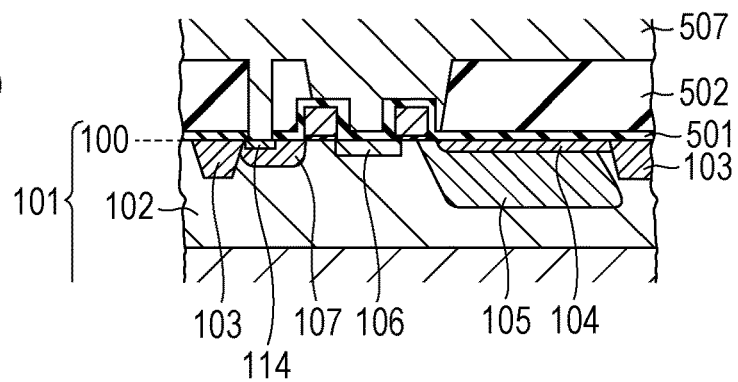
FIG. 5D is a schematic sectional view illustrating the method of manufacturing the solid-state image pickup device according to the second embodiment.

After removing the photoresist pattern 506, a conductor film 507 is formed (FIG. 5D). The conductor film 507 is, e.g., a layered film of titanium nitride and tungsten. Etching or CMP is performed on the conductor film 507 to remove an extra portion of the conductor film 507. Thus, the conductor 115 is formed in the contact hole and the light shielding film 401 is formed in the opening that is a portion formed by removing a part of the insulating film 502, whereby the structure of FIG. 4A is obtained. Here, the insulating film 501 becomes the insulating film 112, and the insulating film 502 becomes the insulating film 113.

In such a manner, the light shielding film 401 may be formed in the insulating film 113 in which the conductor 115 serving as the contact plug is disposed. Further, the light shielding film 401 may be formed in the same operation as that for forming the conductor 115 serving as the contact plug. More specifically, the operations of forming the contact hole and the opening, forming the conductor film, and removing the extra portion of the conductor film may be performed in the same operations. While the conductor 115 and the light shielding film 401 may be formed through separate operations, the manufacturing process may be simplified by forming them through the same operations.

Figure 4B:
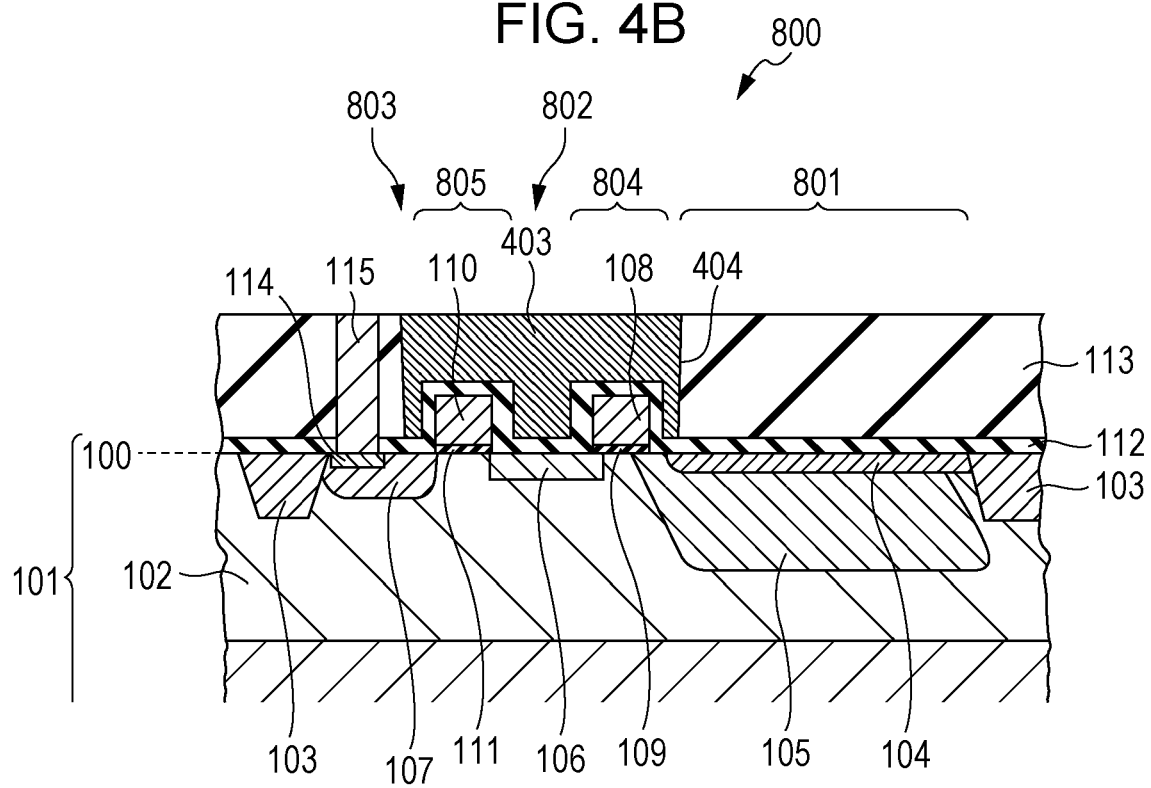
FIG. 4B is a schematic sectional view of the solid-state image pickup device according to the second embodiment.

FIG. 4B illustrates a modification of the structure illustrated in FIG. 4A. Description of the same components in FIG. 4B as those in FIG. 4A is omitted. In FIG. 4B, a light shielding film 403 is formed to extend from a position above the N-type semiconductor region 107 up to a position above the photoelectric conversion portion 801 while covering the gate electrode 110 and the gate electrode 108. Such an arrangement may further reduce incoming of light into the N-type semiconductor region 106 from the side of the gate electrode 110 closer to the N-type semiconductor region 107.

Moreover, FIGS. 4A and 4B differ from each other in inclination of lateral surfaces of the light shielding film. A lateral surface 404 of the light shielding film 403 in FIG. 4B is perpendicular to the surface 100 of the semiconductor substrate 101, while the lateral surface 402 of the light shielding film 401 in FIG. 4A is inclined relative to the surface 100. Those shapes of the lateral surface of the light shielding film are optionally selectable. The shape of the lateral surface of the light shielding film may be optionally formed by controlling the photoresist pattern or etching conditions when the opening for the light shielding film is formed in the insulating film 113.

The wiring structure described above in the first embodiment may also be applied to the second embodiment. Further, the above-described structures may be combined with each other as appropriate. For example, the arrangement of the light shielding film in FIG. 4A may be modified as per illustrated in FIG. 4B.

Third Embodiment

A solid-state image pickup device according to a third embodiment will be described below with reference to FIG. 6F. FIG. 6F is a schematic sectional view of the solid-state image pickup device, the view corresponding to FIG. 4A. The same components in FIG. 6F as those in FIG. 4A are denoted by the same reference numerals and description of those components is omitted.

FIG. 6F differs from FIG. 4A in the presence of an insulating film 601 (third insulating film). An insulating film 601 is a silicon oxide film, for example. The insulating film 601 is disposed in an opening of the insulating film 113 and is positioned between a light shielding film 602 and the insulating film 113. Such an arrangement may increase insulation performance between the light shielding film 602 and the semiconductor substrate 101 or between the light shielding film 602 and the gate electrode.

A method of manufacturing the solid-state image pickup device according to the third embodiment will be described below with reference to FIGS. 2A to 2D and 6A to 6E. The same components in FIGS. 6A to 6E as those in FIG. 6F are denoted by the same reference numerals and description of those components is omitted. Description of similar manufacturing operations to those in the first embodiment (FIGS. 2A to 2G) is also omitted.

Figure 6A:
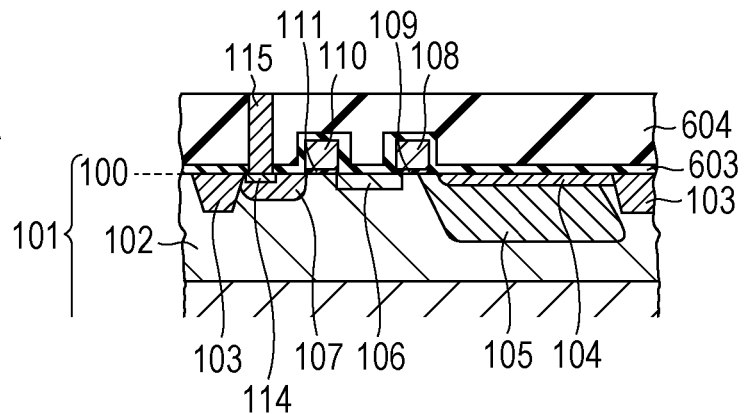
FIG. 6A is a schematic sectional view illustrating a method of manufacturing a solid-state image pickup device according to a third embodiment.

FIG. 6A illustrates the same structure as that illustrated in FIG. 2D. The insulating film 112 and the insulating film 202 in FIG. 2D are denoted respectively by an insulating film 603 and an insulating film 604 in FIG. 6A. The structure of FIG. 6A may be obtained through the operations of FIGS. 2A to 2C.

Figure 6B:
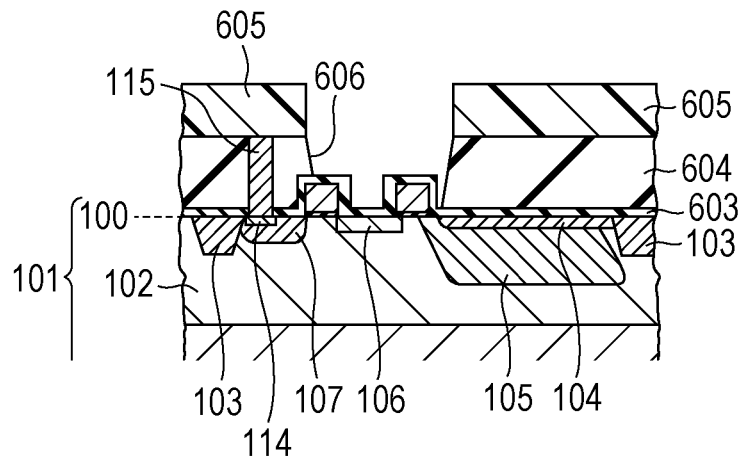
FIG. 6B is a schematic sectional view illustrating the method of manufacturing a solid-state image pickup device according to the third embodiment.
Figure 6C:
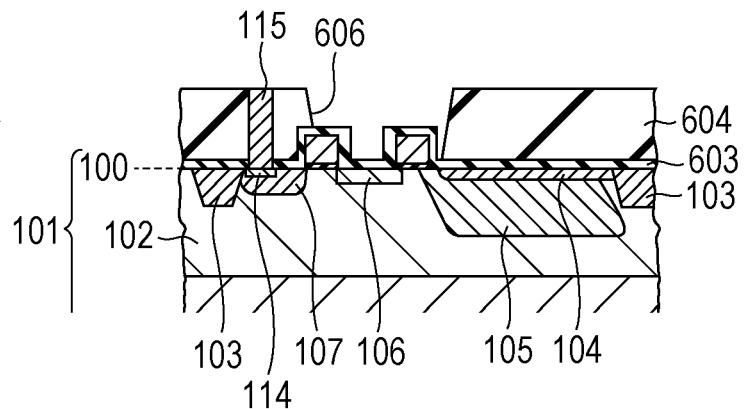
FIG. 6C is a schematic sectional view illustrating the method of manufacturing a solid-state image pickup device according to the third embodiment.

Next, as illustrated in FIG. 6B, a photoresist pattern 605 is formed on the insulating film 604. The photoresist pattern 605 serves as a mask for use in forming a light shielding film 602 in the insulating film 604. Therefore, the photoresist pattern 605 has an opening to form the light shielding film 602. Etching is then carried out on the insulating film 604 with the photoresist pattern 605 used as a mask, thereby removing a part of the insulating film 502 and forming the contact hole 504 and an opening 606 for the light shielding film 602 in the insulating film 604. At that time, the insulating film 603 may function as an etching stopper in the above-described etching. After forming the opening 606, the photoresist pattern 605 is removed (FIG. 6C).

Figure 6D:
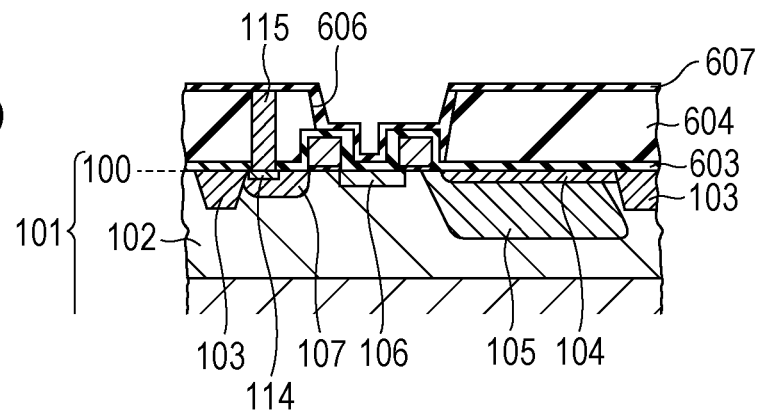
FIG. 6D is a schematic sectional view illustrating the method of manufacturing a solid-state image pickup device according to the third embodiment.
Figure 6E:
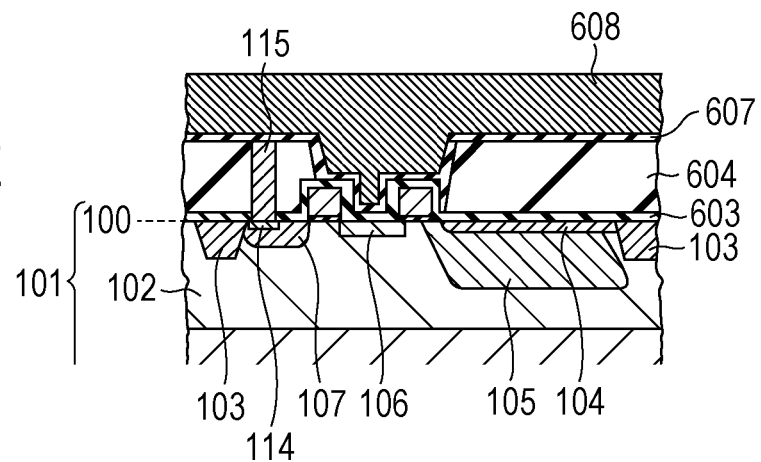
FIG. 6E is a schematic sectional view illustrating the method of manufacturing a solid-state image pickup device according to the third embodiment.
Figure 6F:
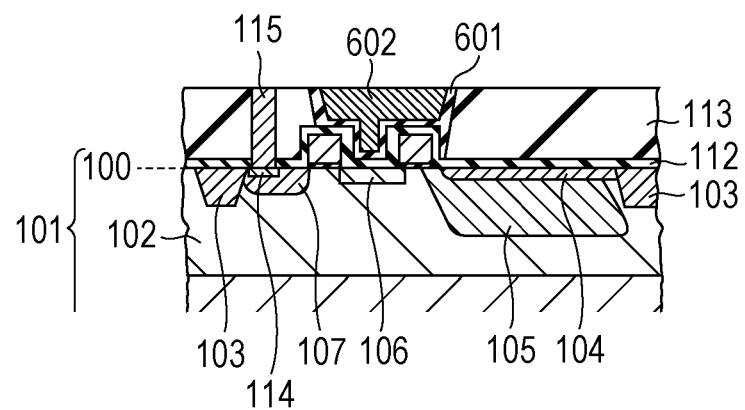
FIG. 6F is a schematic sectional view illustrating the method of manufacturing a solid-state image pickup device according to the third embodiment.

Next, as illustrated in FIG. 6D, an insulating film 607 is formed to cover the insulating film 604, the conductor 115, and the insulating film 603 exposed in the opening 606. The insulating film 607 is a silicon oxide film, for example. Further, the insulating film 607 is formed following respective shapes of the gate electrodes 108 and 110, lateral walls of the opening 606, etc.

A conductor film 608 serving as a light shielding film is then formed over the insulating film 607 (FIG. 6D). The conductor film 608 is, e.g., a layered film of titanium nitride and tungsten. As in the above-described embodiments, etching or CMP is performed on the conductor film 608 to remove an extra portion of the conductor film 608. An extra portion of the insulating film 607 disposed on the insulating film 604 is further removed such that an upper surface of the conductor 115 is exposed. Thus, the light shielding film 602 and the insulating film 601 are formed in the opening for the light shielding film, whereby the structure of FIG. 6F is obtained. Here, the insulating film 604 becomes the insulating film 113.

In such a manner, the light shielding film 602 may be formed in the insulating film 113 in which the conductor 115 serving as the contact plug is disposed. Further, the insulating film 601 may be formed to increase the insulation performance for the light shielding film 602. It is to be noted that the manufacturing method for third embodiment is not limited to the above-described one and the manufacturing method described in the second embodiment may also be applied to the third embodiment. For example, the contact hole for the conductor 115 and the opening for the light shielding film 602 may be formed in the same operation, or in one operation.

Fourth Embodiment

A solid-state image pickup device according to a fourth embodiment will be described below with reference to FIGS. 7A and 7B. The solid-state image pickup device according to the fourth embodiment is a solid-state image pickup device including image pickup pixels and focus detection pixels. In comparison with the solid-state image pickup devices according to the first to third embodiments, the carrier holding portion and the second transfer transistor are not included in the fourth embodiment. The same components in FIGS. 7A and 7B as those in FIG. 1A, etc. are denoted by the same reference numerals and description of those components is omitted.

Figure 7A:
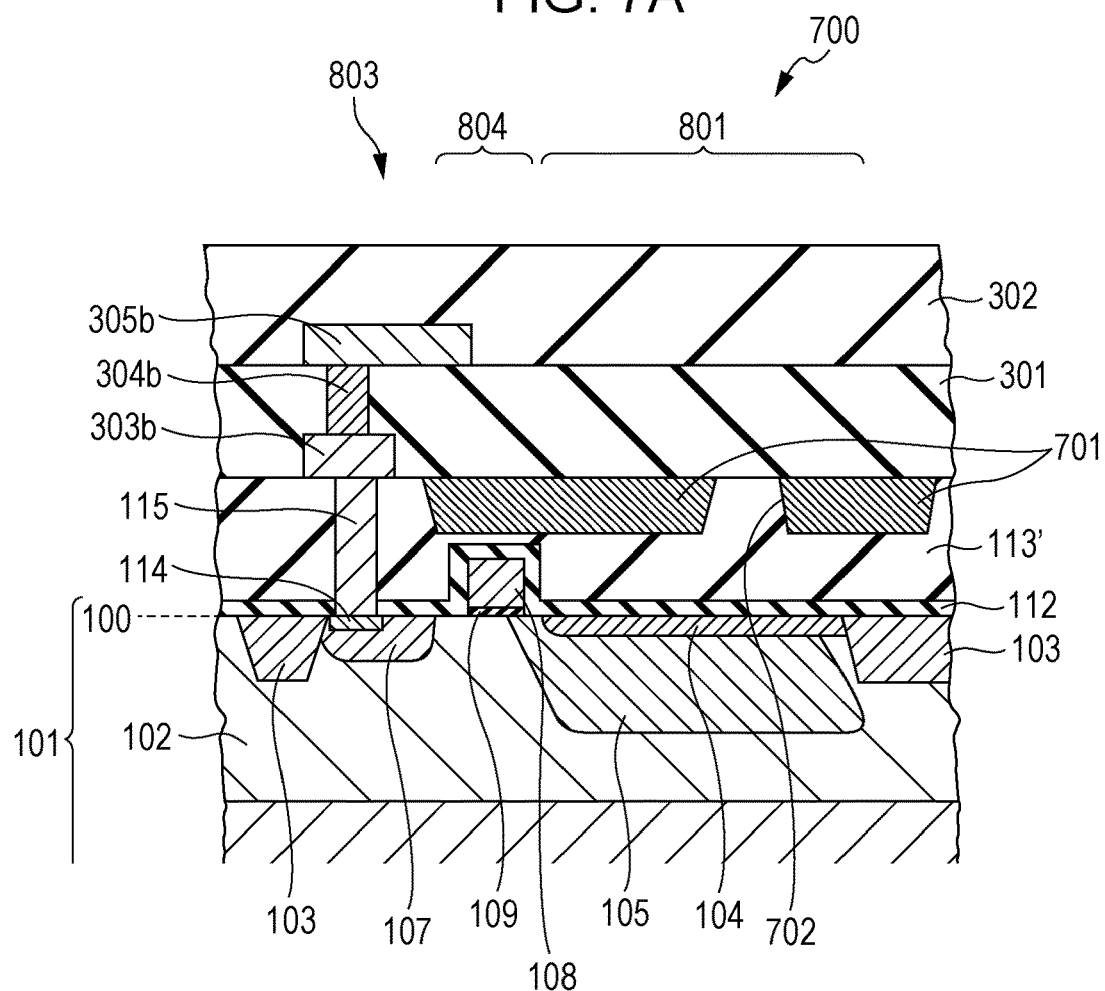
FIG. 7A is a schematic sectional view of a solid-state image pickup device according to a fourth embodiment.
Figure 7B:
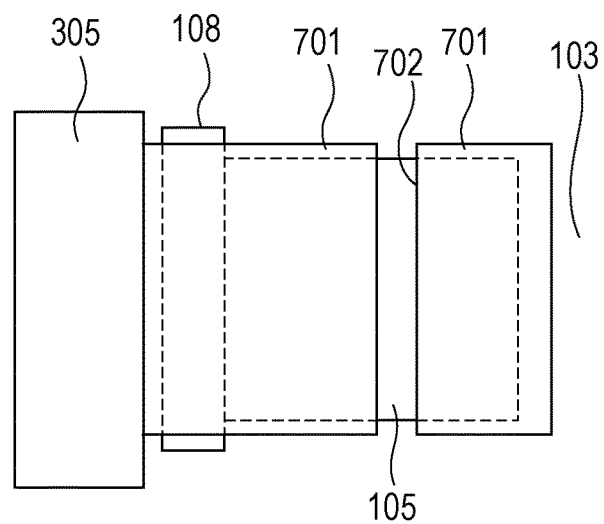
FIG. 7B is a schematic plan view of the solid-state image pickup device according to the fourth embodiment.

FIG. 7A is a schematic sectional view illustrating the photoelectric conversion portion 801, the floating diffusion portion (FD portion) 803, and a light shielding film 701 for focus detection, which are disposed in a focus detection pixel 700. In FIG. 7A, the conductor 115 and the light shielding film 701 having a slit 702 are disposed in an insulating film 113' that is disposed above the N-type semiconductor region 105 constituting the photoelectric conversion portion 801. An insulating film 301 and an insulating film 302, both being similar to those in FIG. 3A and the insulating film 302 being present on the insulating film 301, are disposed over the light shielding film 701. Further, a wiring 303b in a first wiring layer 303 and a via 304b in a via layer 304 are disposed in the insulating film 301. A wiring 305b in a second wiring layer 305 is disposed in the insulating film 302. FIG. 7B illustrates the positional relationship among the second wiring layer 305, the light shielding film 701, the semiconductor region 105 constituting the photoelectric conversion portion 801, and the gate electrode 108 of the first transfer transistor 804 in FIG. 7A.

The slit 702 of the light shielding film 701 is offset from the center of gravity of the photoelectric conversion portion 801. In this embodiment, the slit 702 is arranged offset to the right in FIG. 7A. Focus detection may be performed, for example, by obtaining data with the pixel constructed as described above and with a pixel (not illustrated) including the light shielding film that has a slit arranged offset to the left in FIG. 7A.

Further, the light shielding film 701 is disposed in the insulating film 113' along with the conductor 115 as in the first to third embodiments. With such an arrangement, light for the focus detection may be separated into two parts at a position close to the N-type semiconductor region 105 constituting the photoelectric conversion portion 801, and accuracy in the focus detection may be increased. Moreover, it is possible to reduce mixing of light into the semiconductor region 107 constituting the FD portion 803 and to obtain higher light shielding performance.

The focus detection pixel according to this embodiment may be modified to have a structure including the carrier holding portion illustrated in FIG. 8.

As an application example of the solid-state image pickup device according to any of the foregoing embodiments, an image pickup system incorporating the relevant solid-state image pickup device will be described below. The image pickup system includes not only a device primarily intended for photographing, such as a camera, but also a device (such as a personal computer or a portable terminal) having the photographing function as an auxiliary function. For example, the camera includes the solid-state image pickup device according to one of the foregoing embodiments, and a signal processing unit for processing a signal output from the solid-state image pickup device. The signal processing unit may include, e.g., a processor for processing digital data.

In the above description of the embodiments, the structure above the light shielding film in the solid-state image pickup device is omitted. Above the light shielding film, a wiring structure, a protection film, a color filter, an in-layer lens, a microlens, etc. are disposed as appropriate. Further, each of the above-described embodiments is merely an example and may be optionally modified, and those embodiments may be optionally combined with each other. Moreover, applications of the light shielding film are not limited to solid-state image pickup devices having the global electronic shutter function and the focus detection function. The light shielding film may also be applied to solid-state image pickup devices having other functions, such as a function of enlarging a dynamic range.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion device comprising:
   a plurality of pixels, at least one of the plurality of pixels including:
   first transfer transistor configured to transfer carriers stored at a first semiconductor region in a substrate to a second semiconductor region in the substrate,
   a second transfer transistor configured to transfer the carriers held at the second semiconductor region to a third semiconductor region in the substrate,
   an amplification transistor configured to output a signal based on a potential of the third semiconductor region;
   a contact plug connected to the third semiconductor region; and
   a metal film including
   a first bottom surface located above an upper surface of a gate electrode of the first transfer transistor,
   a second bottom surface located above the first semiconductor region, and
   a third bottom surface located at a side opposing to the first semiconductor region across the gate electrode in a planar view,
   wherein with respect to a distance in a direction perpendicular to a surface of the substrate, a first distance between the first bottom surface and the surface of the substrate is larger than a second distance between the second bottom surface and the surface of the substrate and a third distance between the third bottom surface and the surface of the substrate, and
   wherein with respect to the distance in the direction, the first distance, the second distance, and the third distance are smaller than a fourth distance between an upper surface of the contact plug and the surface of the substrate.

2. The photoelectric conversion device according to claim 1, further comprising:
   a first insulating film disposed over at least a part of the first transfer transistor and at least a part of the second transfer transistor; and
   a second insulating film made of a different material from that of the first insulating film,
   wherein the second insulating film is disposed between the second bottom surface of the metal film and the surface of the substrate, and between the third bottom surface of the metal film and the surface of the substrate.

3. The photoelectric conversion device according to claim 1, wherein the metal film is configured to overlap an edge of the gate electrode on the first semiconductor region side and an edge of the gate electrode on the second semiconductor region side, in planar view.

4. The photoelectric conversion device according to claim 2, wherein a bottom surface of the second insulating film is located closer to the surface of the substrate than the upper surface of the gate electrode.

5. The photoelectric conversion device according to claim 1, wherein the metal film is located over a gate electrode of the second transfer transistor.

6. The photoelectric conversion device according to claim 5, wherein the third bottom surface is located between the gate electrode of the first transfer transistor and the gate electrode of the second transfer transistor.

7. The photoelectric conversion device according to claim 2, wherein the second insulating film is in contact with the second bottom surface or the third bottom surface of the metal film.

8. The photoelectric conversion device according to claim 2, wherein the second insulating film is in contact with the second bottom surface and the third bottom surface of the metal film.

9. The photoelectric conversion device according to claim 2, wherein the second insulating film is continuously provided between the first bottom surface of the metal film and the surface of the substrate, between the second bottom surface of the metal film and the surface of the substrate, and between the third bottom surface of the metal film and the surface of the substrate.

10. The photoelectric conversion device according to claim 1, wherein an upper surface of the first insulating film and an upper surface of the metal film are substantially on a same plane.

11. The photoelectric conversion device according to claim 2, wherein the first insulating film is a silicon oxide film, and the second insulating film is a silicon nitride film or a silicon oxynitride film.

12. The photoelectric conversion device according to claim 2, wherein with respect to the distance in the direction perpendicular to the surface of the substrate, a distance between a bottom surface of the second insulating film and the surface of the substrate is smaller than the distance between the upper surface of the gate electrode and the surface of the substrate.

13. The photoelectric conversion device according to claim 1, wherein the metal film contains tungsten.

14. The photoelectric conversion device according to claim 1, further comprising:
a first insulating film disposed over at least a part of the first transfer transistor and at least a part of the second transfer transistor,
wherein the first bottom surface is located below an upper surface of the first insulating film.

15. The photoelectric conversion device according to claim 1, wherein the second bottom surface is configured to overlap the first semiconductor region and the third bottom surface is configured to overlap the second semiconductor region in a planar view.

16. The photoelectric conversion device according to claim 1, wherein the plurality of pixels are arranged in a matrix pattern, and a plurality of amplification transistors are provided such that each of the plurality of amplification transistors corresponds to each of the plurality of pixels.

17. The photoelectric conversion device according to claim 1, wherein the plurality of pixels are arranged in a matrix pattern, and one of the plurality of amplification transistors is shared by a plurality of pixels.

18. An image pickup system comprising:
the photoelectric conversion device according to claim 1; and
a processing unit configured to process a signal from the amplification transistor.

* * * * *